(12) United States Patent
Trenz et al.

(10) Patent No.: US 9,513,331 B2
(45) Date of Patent: Dec. 6, 2016

(54) TEST HEAD FOR ELECTRICAL TESTING OF A TEST SPECIMEN

(71) Applicants: Stefan Trenz, Bodelshausen (DE); Gunther Böhm, Nufringen (DE); Achim Weiland, Mannheim (DE)

(72) Inventors: Stefan Trenz, Bodelshausen (DE); Gunther Böhm, Nufringen (DE); Achim Weiland, Mannheim (DE)

(73) Assignee: FEINMETALL GMBH (DE)

( * ) Notice: Subject to any disclaimer, the term of this patent is extended or adjusted under 35 U.S.C. 154(b) by 0 days.

(21) Appl. No.: 13/957,868

(22) Filed: Aug. 2, 2013

(65) Prior Publication Data
US 2014/0049278 A1    Feb. 20, 2014

(30) Foreign Application Priority Data
Aug. 16, 2012 (DE) .................. 10 2012 016 449

(51) Int. Cl.
G01R 31/00 (2006.01)
G01R 31/28 (2006.01)
G01R 1/073 (2006.01)

(52) U.S. Cl.
CPC ....... G01R 31/2886 (2013.01); G01R 1/07314 (2013.01); *G01R 1/07357* (2013.01)

(58) Field of Classification Search
CPC .......... G01R 1/07314; G01R 1/07328; G01R 1/07335; G01R 1/07357; G01R 31/2886; G01R 31/2887; G01R 31/2889
USPC .................................. 324/750.25
See application file for complete search history.

(56) References Cited

U.S. PATENT DOCUMENTS

| 5,773,988 | A | * | 6/1998 | Sayre et al. ............. 324/750.25 |
| 5,949,243 | A | | 9/1999 | Grasso .......................... 324/761 |
| 5,990,696 | A | | 11/1999 | Swart |
| 6,127,835 | A | | 10/2000 | Kocher ......................... 324/761 |
| 6,144,212 | A | * | 11/2000 | Mizuta ..................... 324/755.04 |
| 6,150,830 | A | * | 11/2000 | Schmid et al. .......... 324/756.03 |
| 6,417,684 | B1 | * | 7/2002 | Schmid et al. .......... 324/750.25 |
| 7,592,821 | B2 | | 9/2009 | Eldridge et al. |
| 7,795,892 | B2 | | 9/2010 | Yamada et al. |
| 8,217,675 | B2 | | 7/2012 | Boehm et al. |

(Continued)

FOREIGN PATENT DOCUMENTS

JP    H10-019960 A    1/1998
JP    2001-074779 A    3/2001

(Continued)

OTHER PUBLICATIONS

Japanese Office Action dated Feb. 17, 2015 in corresponding Japanese Patent Application No. 2013-168767 (with English language translation)(12 pages).
Taiwan Office Action, dated Apr. 30, 2015, issued in corresponding Taiwan Patent Application No. 102126297. Including English translation. Total 14 pages.

*Primary Examiner* — Jermele M Hollington
*Assistant Examiner* — Demetrius Pretlow
(74) *Attorney, Agent, or Firm* — Ostrolenk Faber LLP

(57) ABSTRACT

The present disclosure relates to a test head for electrical testing of a test specimen, in particular a wafer, having at least two guide plates, which are spaced apart by means of at least one spacer and have guide holes distributed over the surfaces thereof, in which test contact pins for physical contact with the test specimen are guided in a sliding manner. Provision is made for the spacer to be formed by a multiplicity of point supports arranged in a manner distributed over the surfaces of the guide plates and secured on the guide plates.

22 Claims, 6 Drawing Sheets

(56) References Cited

U.S. PATENT DOCUMENTS

| | | |
|---|---|---|
| 8,230,593 B2 * | 7/2012 | Kister .............................. 29/884 |
| 2005/0151547 A1 * | 7/2005 | Machida et al. .............. 324/754 |
| 2007/0128076 A1 | 6/2007 | Bohm |
| 2008/0054919 A1 * | 3/2008 | Wu et al. ...................... 324/754 |
| 2008/0150564 A1 * | 6/2008 | Schmid et al. ............... 324/758 |
| 2008/0191721 A1 | 8/2008 | Bohm et al. |
| 2009/0005854 A1 * | 1/2009 | Huang ...................... A61F 2/91 623/1.15 |
| 2010/0019788 A1 * | 1/2010 | Boehm et al. ................ 324/754 |
| 2010/0176831 A1 * | 7/2010 | Palcisko et al. ............. 324/757 |
| 2010/0182013 A1 * | 7/2010 | Lou ................................ 324/555 |
| 2013/0069683 A1 * | 3/2013 | Kuo et al. ................ 324/755.03 |

FOREIGN PATENT DOCUMENTS

| | | |
|---|---|---|
| JP | 2004197559 A * | 7/2004 |
| JP | 2005-338068 A | 12/2005 |
| JP | 2007-158345 A | 6/2007 |
| JP | 2007-178405 A | 7/2007 |
| JP | 2008-209408 A | 9/2008 |
| JP | 2008-539394 A | 11/2008 |
| JP | 2010-032519 A | 2/2010 |

\* cited by examiner

TEST HEAD FOR ELECTRICAL TESTING OF A TEST SPECIMEN

CROSS-REFERENCE TO RELATED APPLICATIONS

This application claims priority of German Patent Application No. 10 2012 016 449.1, filed Aug. 16, 2012, the disclosure of which is incorporated herein by reference.

FIELD OF THE INVENTION

The invention relates to a test head for electrical testing of a test specimen, in particular a wafer, having at least two guide plates, which are spaced apart by means of at least one spacer and have guide holes distributed over the surfaces thereof, in which test contact pins for physical contact with the test specimen are guided in a sliding manner.

BACKGROUND OF THE INVENTION

Test heads of this kind are known for testing electric and electronic circuits, especially for testing wafers. For electrical testing, test contact pins of the test head are brought into physical contact with corresponding electric surface contacts of the test specimen, e.g. by raising the test specimen by means of a lifting device and, in the process, pressing it against the ends of the test contact pins. During the contacting of the test specimen, the other ends of the test contact pins come up against surface contacts of a contact clearance enlargement device which serves to increase the contact clearance. In this context, it should be noted that the surface contacts of the wafer are within a very restricted area, and therefore the test contact pins, which are, in particular, designed as buckling beams, have only minimal contact clearances with respect to one another. By means of the contact clearance enlargement device, the contact clearances can be increased to such an extent that it is possible, by means of connection leads, to connect a testing device which switches test paths during electrical testing in order to test the test specimen for electric functioning capacity. The test contact pins are held by means of guide plates, wherein at least two guide plates are arranged spaced apart and have guide holes through which the test contact pins pass. The guide plates are made of an electrically nonconductive material, e.g. ceramics. The test contact pins are composed of a material of very good electrical conductivity which simultaneously has a certain elasticity to enable the test contact pins to bend sideways slightly during physical contact. In order to position the at least two guide plates relative to one another and to keep them apart, a spacer is provided, said spacer being formed by a plurality of cross-struts extending over the entire length of the plates and arranged spaced apart and adjacent to one another. These cross-struts take up a relatively large amount of space, which is not available as a test surface since it is not possible to arrange any test contact pins there. Moreover, there is the disadvantage that contact accuracy is not always assured owing to the effect of temperature, since a kind of bimetallic effect arises, leading possibly to distortions, i.e. the test contact pins come to rest inaccurately or not at all on the surface contacts of the test specimen which are to be contacted and/or on those of the contact clearance enlargement device, with the result that incorrect measurements are performed. The effect of temperature is evident particularly when the test specimen is exposed to different test temperatures during electrical testing in order to test its functioning capacity in a temperature range. The temperature range can extend from double-digit minus temperatures to triple-digit plus temperatures.

It is therefore the underlying object of the invention to specify a test head of the type stated at the outset which ensures highly accurate contacting which is maintained even at different temperatures, while furthermore an enlarged test area is available.

SUMMARY OF THE INVENTION

According to the invention, this object is achieved by virtue of the fact that the spacer is formed by a multiplicity of point supports arranged in a manner distributed over the surfaces of the guide plates and secured on the guide plates. The term "point supports" should be taken to mean spacer elements which take up only a relatively small cross section in the surface of the respective guide plate. Accordingly, the overall cross section of a plurality of spacer elements arranged, for example, distributed in rows over the surfaces of the guide plates is significantly less than the cross-sectional area of a known cross-strut, which extends over the correspondingly identical area. The interspace between the spacer elements provided in the invention can be used to accommodate test contact pins, that is to say can be used as an active test area. The term "point supports" does not mean that the spacer formed supports the two guide plates at very closely adjacent locations but that they can have a predeterminable spacing with respect to one another, in which case the respective point support has a relatively small area but a length of a magnitude that can be selected in an appropriate manner. The point supports arranged in a manner distributed over the surfaces of the guide plates and secured on the guide plates create a very rigid assembly from the participating components, with the result that sagging of at least one guide plate is avoided or substantially avoided. This sagging occurs, for example, if the density of the test contact pins is very high and the test contact pins extend in a slight arc to allow an axial spring action, with the result that frictional forces of the test contact pins in the guide holes arise during the making of physical contact, leading to the mentioned bending of the at least one guide plate. Since a more rigid assembly is provided by virtue of the invention as compared with the strip-shaped cross-struts of the prior art, the problem of the bending of the at least one guide plate is solved since the rigidity of the arrangement is very great owing to the point supports arranged in a manner distributed over the surface.

According to a development of the invention, provision is made for one guide plate to be a first guide plate and for the other guide plate to be a second guide plate, wherein the second guide plate is a guide plate close to the test specimen and the first guide plate is a guide plate remote from the test specimen. The second guide plate is therefore oriented in the direction of the test specimen or of a test specimen holder. The first guide plate is oriented in the direction of the contact clearance enlargement device or of the testing device.

According to a development of the invention, provision is made for a further, third guide plate to be arranged adjacent to the first guide plate, wherein each test contact pin is assigned a first guide hole in the first guide plate, a second guide hole in the second guide plate, and a third guide hole in the third guide plate, wherein the second and third guide holes are in alignment with one another and the first guide hole is offset with respect to the alignment of the second and third guide holes, or all three guide holes are offset with respect to one another. This offset of the first guide hole, as mentioned in the first-mentioned alternative, forces the respective test contact pin into an arc shape, which entails an axial spring action during the physical contacting of the test specimen. Moreover, a "scrub" occurs during the landing of the respective test contact pin on the test surface of the test specimen, i.e. the test contact pin scrapes along the contact surface over a short distance transversely to the longitudinal extent of the test contact pin, thereby improving electric contact levels. For example, an oxide layer on the contact surface is thereby penetrated. As an alternative, however, it is also possible for the guide plates to have non-aligned guide holes, i.e. for all the guide holes to be offset with respect to one another. The test contact pins are then guided in a corresponding arc. According to another embodiment of the invention, provision can also be made for there to be a minimal offset between the second and third guide holes. The first guide hole can then be in alignment with one of the guide holes, i.e. with the second guide hole or with the third guide hole, or can be in alignment neither with the second guide hole nor with the third guide hole (as already mentioned).

According to a development of the invention, provision is made for the point supports to be designed as supporting struts, in particular compression- and tension-resistant supporting struts. These supporting struts are thus pin-shaped components which are arranged so as to extend longitudinally between the guide plates to form the spacer. By virtue of the compression and tension resistance thereof, the supporting struts together with the guide plates form a rigid structure resistant to sagging.

In particular, each of the point supports has a direction of longitudinal extent and, transversely, in particular at right angles, thereto, a multiplicity of radial directions distributed over an angular range of 360°.

The arrangement is now preferably such that the mechanical strength of each of the point supports in at least one of the radial directions is less than in the other radial directions. The point supports are therefore provided with different mechanical strengths in the radial directions over the angular range of 360°, with the mechanical strength being less in at least one of the radial directions than in the other radial directions. There is therefore a certain "softness". In practice, it will be possible to assign to this radial direction a further radial direction offset by 180° which likewise has the lower mechanical strength. The term "radial direction" should preferably be taken to mean an angular range of radial directions since the mechanical strength of the point supports will not change abruptly in different radial directions but continuously.

According to a development of the invention, provision is made for each of the point supports to have at least one cross section weakening zone in order to achieve the lower mechanical strength. A high mechanical strength is thus achieved over a certain angular range of radial directions, namely where the at least one cross section weakening zone has no effect. In the angular range in which the cross section weakening zone acts, the mechanical strength of the respective point support is lower, making possible a slight bending of the point support.

In particular, provision can be made for each of the point supports to have a cross section weakening zone on mutually opposite sides of the circumference thereof. In a certain radial angular range, this results as it were in a waist in the respective point support, resulting in a correspondingly angle-oriented reduction in mechanical strength.

According to a development of the invention, provision is made for each of the point supports to have a first end zone, a central zone adjoining the latter, and a second end zone adjoining said central zone in the direction of longitudinal extent, and for the central zone to have the at least one cross section weakening zone. In the direction of longitudinal extent, slight bending of the corresponding point supports can therefore take place in the region of the central zone if appropriate forces occur. According to a development of the invention, provision can be made for each of the point supports to have at least one aperture in the region of the at least one cross section weakening zone. In the region, namely in the central zone, in which the at least one cross section weakening zone is situated, at least one aperture can therefore be provided, contributing to the reduction in strength dependent on the circumferential angle.

If, as a preferred option, at least one aperture is provided, at least two supporting arms between the end zones of the respective point support are thereby formed. This means that there is a high bending stiffness in a plane in which the two supporting arms lie. In a plane at 90° thereto, on both sides of which the two supporting arms lie, the bending stiffness is lower, and therefore the lower mechanical strength mentioned is obtained here. Despite the at least one cross section weakening zone and/or the at least one aperture, in particular for the formation of the supporting arms, there is a high stability owing to the compression and tension resistance mentioned of the point supports over the longitudinal extent thereof, and therefore there is no sagging of the guide plates.

The arrangement is preferably such that the supporting arms extend parallel or substantially parallel to one another, and that the supporting arms extend parallel or substantially parallel to the direction of longitudinal extent of the respective point support.

A development of the invention makes provision for the two end zones to have end faces for support on the guide plates. The individual point supports are therefore arranged in such a way between the guide plates that the respective end faces formed on the two end zones thereof come up against the guide plates and therefore support the latter.

According to a development of the invention, provision is made for there to be an element of an anti-twist device on at least one of the end faces, said element interacting with a mating element, belonging to the anti-twist device, on the associated guide plate. The respective point support is thereby given a fixed angular alignment secured by the anti-twist device, with the result that the radial direction with the lower mechanical strength occupies a predeterminable and fixed position in relation to the surfaces of the guide plates. In this way, the multiplicity of point supports can be arranged in a desired angular position. If required, they can be positioned in such a way that the effective directions thereof are aligned in a different or the same direction as the lower mechanical strength and/or that, for example, there are groups of point supports with a different or the same effective direction of lower mechanical strength.

In order to secure the two guide plates on one another by means of the spacer, provision is made, in particular, for the end faces of the point supports to be provided with fastening holes, in particular threaded holes, into which ends of the shanks of fastening elements, in particular threaded screw elements, which pass through the guide plates, engage. The fastening elements are preferably designed as threaded screw elements, the threaded shanks of which are screwed into the fastening holes, which are provided with an internal thread, and in this way hold the guide plates.

Provision is furthermore preferably made for the element of the anti-twist device to be at least one projection, which is spaced apart radially from the associated fastening hole, and for the mating element to be a depression in the guide plate. The projection engages in the depression in the guide plate and thereby creates the anti-twist device for the respectively associated point support.

According to a development of the invention, provision is made for the shanks of the fastening elements assigned to one of the end faces to pass through two of the guide plates, wherein spacing components, in particular spacing sleeves, through which the shanks pass, are arranged between these two guide plates and are supported on said guide plates. As a result, two guide plates are arranged on one side of the point supports, which are spaced apart by the spacing components. A further guide plate is arranged on the other side of the point supports. These three guide plates form the first, second and third guide plates mentioned. The third guide plate is the guide plate situated on the outside and supported by the spacing sleeves, and the second guide plate is the guide plate supported by the end faces remote from the spacing sleeves. The first guide plates is that which lies between the two abovementioned guide plates and is supported, on the one hand, on the end faces of the point supports and, on the other hand, on the ends of the spacing sleeves.

According to a development of the invention, provision is made for the point supports to be arranged so as to be rotationally oriented over the surfaces of the guide plates in such a way that the effective directions of lower mechanical strength are aligned with the center of the respective guide plate or approximately with the center of the respective guide plate. This arrangement has advantages particularly in the case of a test on a test specimen involving temperature stressing since it can be assumed on the basis of the heating of the test specimen or on the basis of the cooling thereof that the guide plate close to the test specimen will be heated more strongly or cooled more strongly than the at least one further guide plate situated remote from the test specimen, with the result that there will be small displacements relative to the plane of the guide plate in order to compensate for the temperature differences. These displacements occur because of the temperature expansion coefficients of the materials. Since the point supports are designed to be "softer" in one direction owing to the effective directions of lower mechanical strength, and the effective directions point toward the center or approximately toward the center of the guide plates, there is always a displacement from the center outward, with the result that the sum of the displacement values is not too large. During the displacements of the two guide plates relative to one another, the point supports adopt a correspondingly slightly bent shape, this taking place in a virtually rotationally symmetrical manner with respect to the surfaces of the guide plates owing to the alignment with the center of the effective directions of lower mechanical strength. The point supports are preferably arranged with a matrix-type and/or linear distribution over the surfaces of the guide plates.

Finally, a preferred development of the invention provides a test head in which at least three slotted recesses for accommodating guide pins are provided to form a center centering device, wherein the directions of longitudinal extent of the slotted recesses are aligned with the center of the respective guide plate or approximately with the center of the respective guide plate. If there is an expansion of the test head during temperature stressing, for example, the center centering device ensures that this expansion takes place from the middle, i.e. from the center. The three slotted recesses can be arranged offset with respect to one another by 120°, for example, but other angular arrangements are also conceivable.

The invention furthermore relates to a test apparatus having a test head as described above, wherein the at least three guide pins, preferably arranged in a fixed location, which engage slidably in the at least three slotted recesses in the respective direction of longitudinal extent of the slotted recesses, are provided.

BRIEF DESCRIPTION OF THE DRAWINGS

The drawings illustrate the invention by means of an illustrative embodiment and, in the drawings.

DESCRIPTION OF PREFERRED EMBODIMENTS

Figure 1:
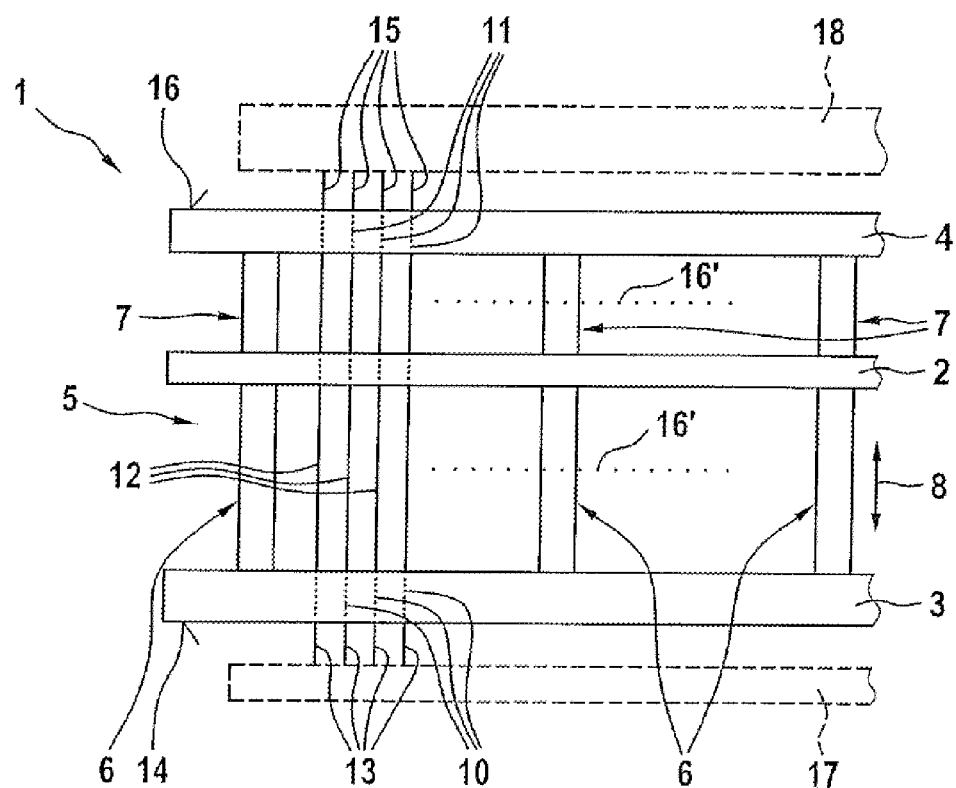
FIG. 1 shows a schematic view of a region of a test head for electrical testing of a test specimen.

FIG. 1 shows an area of a test head 1, which has a plurality of guide plates 2, 3, 4, which are arranged spaced apart, in particular spaced apart and parallel to one another. For this purpose, a spacer 5 is arranged between the guide plates 2 and 3, said spacer being formed by a multiplicity of point supports 6 arranged in a manner distributed over the surfaces of guide plates 2 and 3 and secured on guide plates 2 and 3. Spacing components 7 are furthermore arranged for this purpose between guide plates 2 and 4. The arrangement is now made in such a way that guide plate 2 forms a first guide plate 2, that guide plate 3 forms a second guide plate 3 and that guide plate 4 forms a third guide plate 4. The spacing components 7 are likewise positioned in a distributed arrangement over the surfaces of guide plates 2 and 4, and are preferably aligned with the point supports 6 when viewed in the axial direction (arrow 8).

The first guide plate 2 has a multiplicity of guide holes 9, which form first guide holes, the second guide plate 3 has a multiplicity of guide holes 10, which form second guide holes, and the third guide plate 4 has a multiplicity of guide holes 11, which form third guide holes 11. The guide holes 9 to 11 are penetrated by sliding test contact pins 12, the ends 13 thereof projecting beyond the underside 14 of the second guide plate 3 and the other ends 15 thereof projecting beyond the top side 16 of the third guide plate 4. The arrangement is now made in such a way that the second guide holes 10 and the third guide holes 11 are in alignment with one another and that the first guide holes 9 are offset with respect to this alignment, with the result that the test contact pins 12 have a slight arc shape. For the sake of clarity, only some of the test contact pins 12 are shown in FIG. 1. In reality, said test contact pins 12 are very close together and there is a very large number. This is indicated by the dotted lines 16'. As an alternative, it is also possible—in an illustrative embodiment (not shown) of the invention—for the guide holes in the three guide plates to be arranged in such way that they are all offset with respect to one another.

Also visible in FIG. 1 is a test specimen 17, which is to be subjected to electrical testing. The test specimen is preferably a wafer. FIG. 1 furthermore shows a contact clearance enlargement device 18, which is electrically connected (not shown) to a testing device. In order then to perform an electrical test on the test specimen 17, said test specimen is moved toward the ends 13 of the test contact pins 12 by means of a suitable lifting device (not shown), with the result that surface contacts of the test specimen 17 come into physical contact with the test contact pins 12. During this process, the ends 15 of the test contact pins 12 furthermore come to rest on surface contacts of the contact clearance enlargement device 18, with the result that physical contact is made there too. Testing can then be carried out by means of the testing device (not shown) by switching electrical circuits and testing the electric test specimen 17 for functioning capacity. During this test, which can last several hours, a temperature test is usually carried out as well. This means that the test specimen 17 is exposed to at least one low temperature and at least one elevated temperature, e.g. in a temperature range of from −30° C. to +200° C., in order to test electrical functioning capacity under these conditions too. During the entire test, that is to say also during temperature stressing, it is necessary for satisfactory physical contact with the test specimen 17 and satisfactory physical contact with the contact clearance enlargement device 18 to be maintained, and, owing to the extremely small contact clearances, this means guidance of correspondingly high accuracy and highly accurate retention of the test contact pins 12 by means of the guide plates 2 to 4 and of the spacer 5 and of the spacing components 7.

The specific embodiment of the individual components that can be seen in FIG. 1 will be explained in greater detail below.

Figure 2:
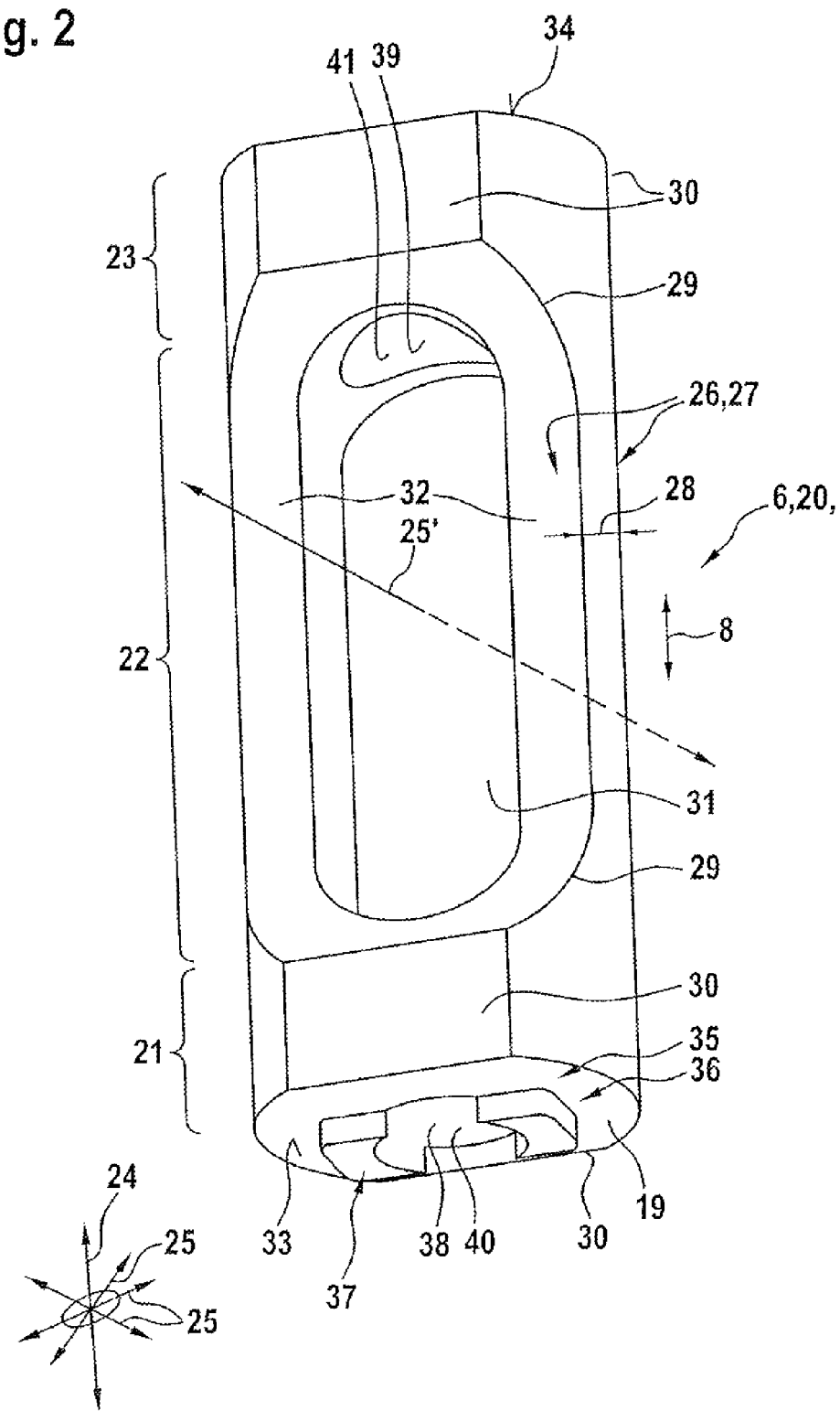
FIG. 2 shows a point support for the test head.

FIG. 2 shows a point support 6. The point support 6 is a spacer element which is of substantially rod-shaped design, i.e. is larger in the direction of the longitudinal extent thereof (arrow 8) than transversely thereto, giving only a relatively small cross section 19. The point support 6 is designed as a compression- and tension-resistant supporting strut 20, i.e. in the direction of longitudinal extent (arrow 8) the supporting strut 20 can absorb both tensile and compressive forces without deformation. In the direction of longitudinal extent, the point support 6 has a first end zone 21, a central zone 22 adjoining the latter and a second end zone 23 adjoining said central zone. For orientation, the direction 24 of longitudinal extent is indicated in FIG. 2 and it runs in the same direction as the axial direction (arrow 8) already mentioned. A multiplicity of radial directions 25 distributed over an angular range of 360°, some of which are indicated in FIG. 2, extend transversely thereto, in particular at right angles thereto. The arrangement is then such that the mechanical strength of the point support 6 in one particular radial direction, namely radial direction 25', is less than in the other radial directions 25. Accordingly, if the point support 6 is subjected to stress in radial direction 25', it can bend slightly in an arc shape. In the other radial directions 25, this bending does not occur under corresponding loading. This lower mechanical strength, i.e. a certain "softness", is deliberately obtained by virtue of the fact that the point support 6 has respective cross section weakening zones 26 (see also FIG. 7) on mutually opposite sides of the circumference thereof. The respective cross section weakening zones 26 are formed by a recess 27 open at the edge and situated in the central zone 22. Accordingly, only a narrow, strip-shaped area of material 18 remains between the two recesses 27. Each recess 27 runs out in an arc 29 at both of its ends. The outline of the two end zones 21 and 23, which corresponds to the cross section 19, is approximately stadium-shaped, in particular circular with flattened areas 30 arranged on mutually opposite sides. In the region of the central zone 22, i.e. in the region of the cross section weakening zone 26, the point support 6 is penetrated by an aperture 31, which has a stadium-shaped cross section and contributes to weakening the material of the cross section weakening zone 26. By virtue of the aperture 31, two mutually parallel supporting arms 32 are formed in the central zone 22. The two supporting arms 32 extend parallel to the direction 24 of longitudinal extent. The two end zones 21 and 23 each have an end face 33 and 34, which serve for support on the associated guide plates 2 and 3. An element 35 of an anti-twist device 36 is formed on end face 33, said element interacting with one of guide plates 2 or 3, depending on which way round the point support 6 is mounted. The element 35 is designed as a projection 37 which lies on both sides of a fastening hole 38, the fastening hole 38 extending in the axial direction, i.e. in the direction 24 of longitudinal extent. A corresponding fastening hole 39 starts from end face 34. Fastening hole 38 passes through the first end zone 21 and opens into the aperture 31; fastening hole 39 passes through end zone 23 and likewise opens into the aperture 31. The two fastening holes 38 and 39 each have an internal thread 40, 41. The projection 37 is arranged radially with respect to the associated fastening hole 38 and does not have a rotationally symmetrical structure. This asymmetric structure of the element 35 of the anti-twist device 36 has a fixed angular association with the radial direction 25', in which there is a lower mechanical strength.

Figure 3:
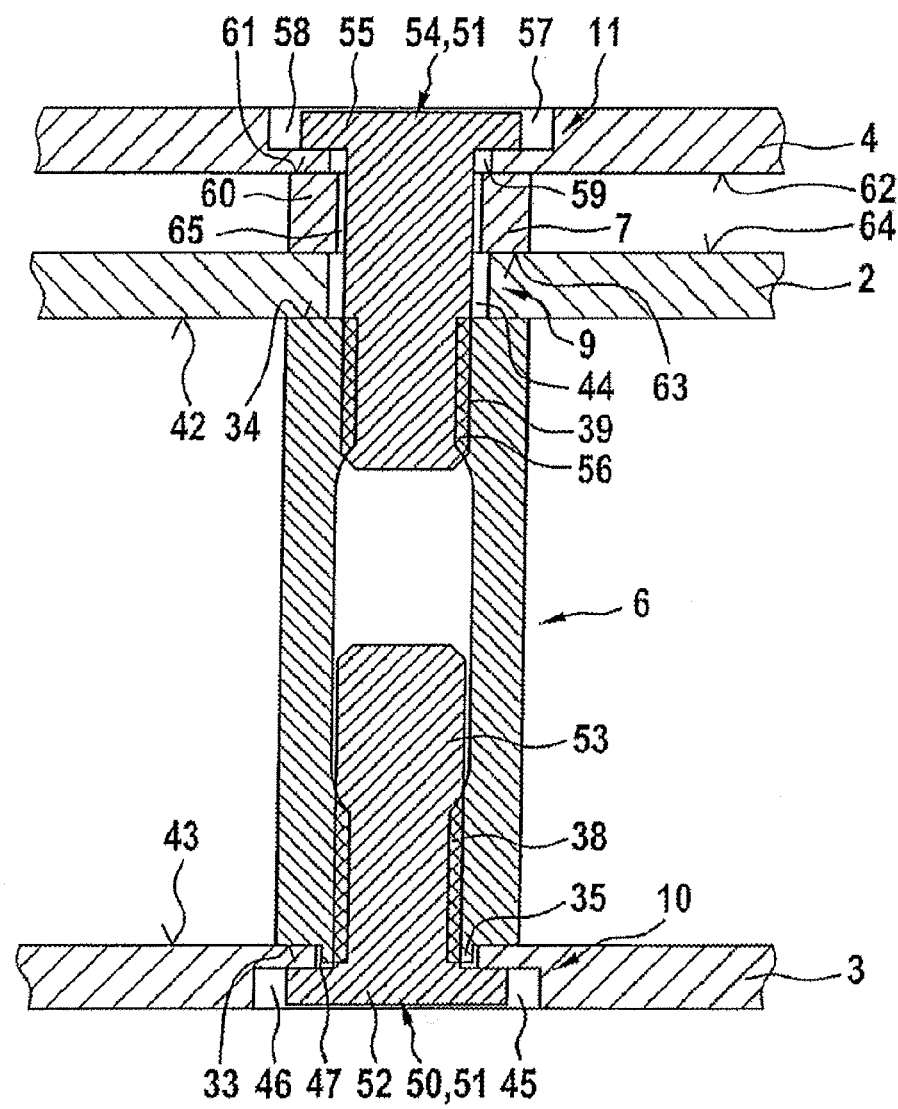
FIG. 3 shows the point supports of FIG. 2 in the installed state for supporting guide plates of the test head.
Figure 6:
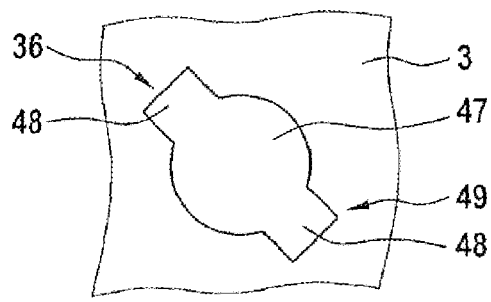
FIG. 6 shows a partial area of the guide plates.

FIG. 3 shows the point support 6 in the installed state, i.e. it is arranged in such a way between the first guide plate 2 and the second guide plate 3 that end face 34 is supported on the underside 42 of guide plate 2 and end face 33 is supported on the top side 43 of guide plate 3. Guide plate 2 is provided with a through hole 44, which is in alignment with fastening hole 39. Guide plate 3 is provided with a stepped hole 45, which passes through guide plate 3 and which is in alignment with fastening hole 38. The stepped hole 45 has a section 46 of larger diameter and a section 47 of smaller diameter. FIG. 6 shows the section 47 of smaller diameter, which merges on mutually opposite sides into recesses that form a depression 48. This depression 48 forms a mating element 49 for the element 35 and, together with the element 35, serves to form the anti-twist device 36. In this context, it can be seen from FIG. 3 that the projection 37 engages in the depression 48. This means that the point support 6 is fixed in terms of angular orientation relative to guide plate 3, i.e. cannot twist. To fasten guide plate 3 and the point support 6 to one another, a fastening element 51 designed as a threaded screw element 50 is provided. The threaded screw element 50 has a head 52 and a shank 53 provided with a thread. The arrangements are made in such a way that the thread of the shank 53 is screwed into the internal thread 40 of fastening hole 38, wherein the head 52 is countersunk into the section 46 of larger diameter of the stepped hole 45. By tightening the threaded screw element 50, a fixed joint is thus formed between guide plate 3 and the point support 6. A fastening element 51 designed as a threaded screw element 54, which has a head 55 and a shank 56 provided with a thread, is likewise provided at the opposite end of the point support 6. Guide plate 4 is provided with a stepped hole 57, which passes through guide plate 4 and has a section 58 of larger diameter and a section 59 of smaller diameter. The spacing component 7 in the form of a spacing sleeve 60 is furthermore arranged in such a way between guide plates 2 and 4 that one end face 61 of the spacing sleeve 60 rests against the underside 62 of guide plate 4 and the other end face 63 of the spacing sleeve 60 comes up against the top side 64 of guide plate 2. Guide plate 4, spacing component 7, guide plate 2 and point support 6 are clamped together firmly in the axial direction by screwing the threaded screw element 54 into the internal thread 41 of fastening hole 39. Here, the head 55 of the threaded screw element 54 is countersunk into the section 58 of larger diameter, and the shank 56 of the threaded screw element 54 passes through the section 59 of smaller diameter of stepped hole 57 and an internal hole 65 in the spacing sleeve 60 and engages in the through hole 44.

Figure 4:
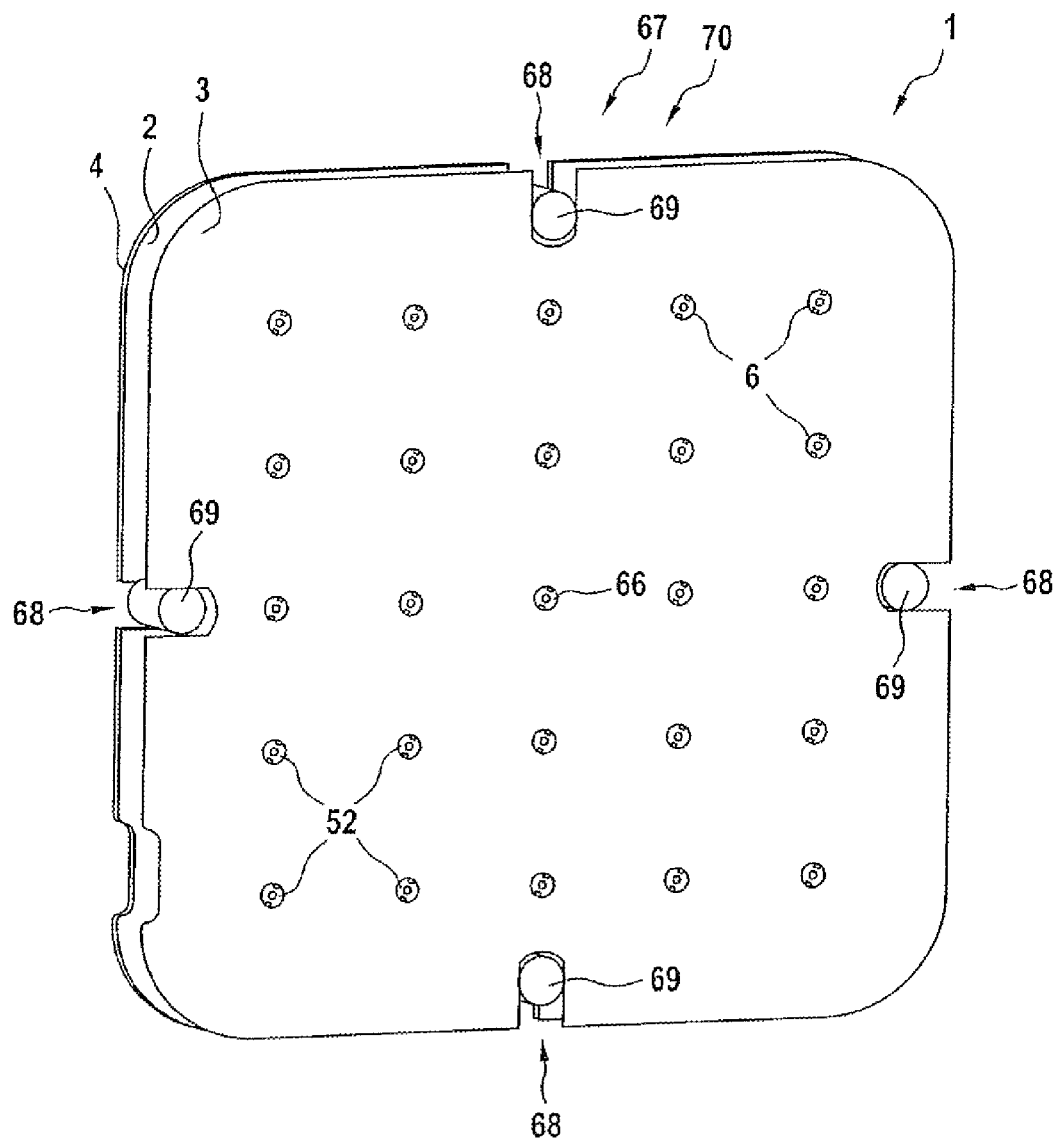
FIG. 4 shows a testing device with a test head in perspective view.

From FIG. 4, it can be seen that the three guide plates 2 to 4 are connected to one another by a multiplicity of point supports 6. In this illustrative embodiment, a corresponding number of spacing components 7 is furthermore used.

The point supports 6 (and the spacing components 7) are preferably arranged in a uniformly distributed manner over the surfaces of the associated guide plates 2 to 4. In FIG. 4, this is implemented in the manner of a matrix. Owing to this cohesion, a very rigid unit, which is resistant to sagging, is created. As already mentioned, it is also possible—according to another illustrative embodiment (not shown) of the invention—for the point supports to be arranged in a linear fashion in order to produce a certain strut-type effect. In this case, a plurality of linear arrangements can preferably be provided in a manner spaced apart from one another.

Figure 5:
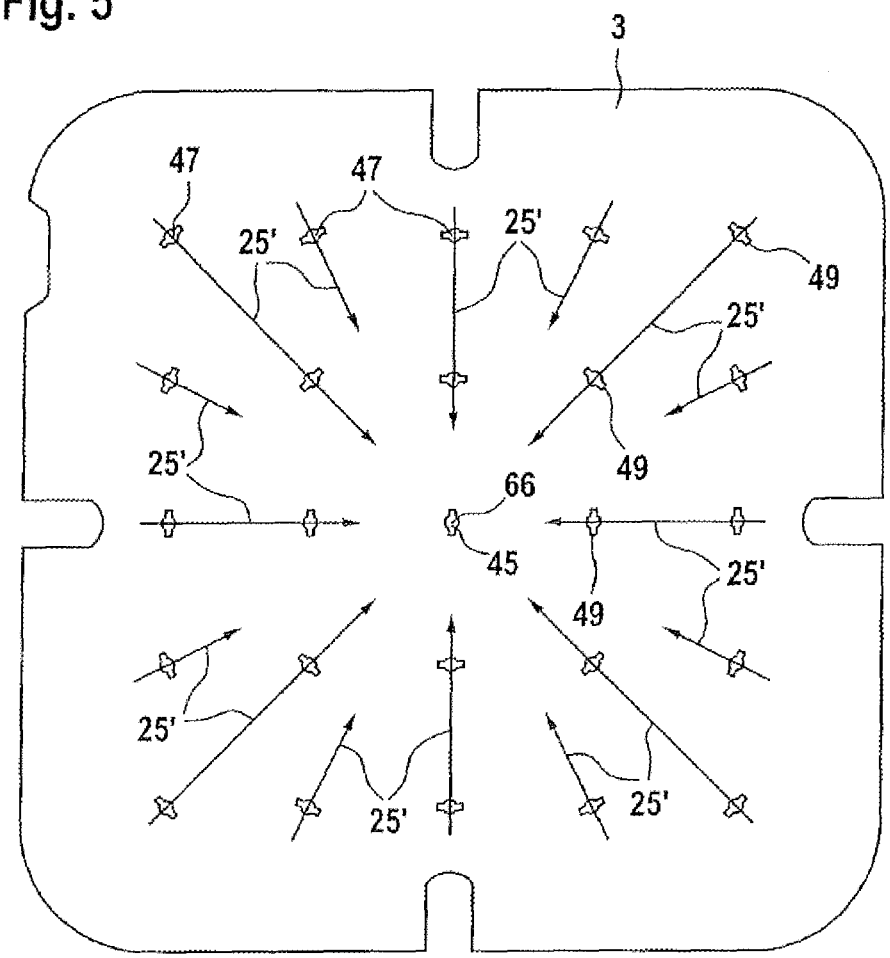
FIG. 5 shows one of the guide plates.

FIG. 5 shows a plan view of guide plate 3 without the further guide plates and also without illustrating the point supports 6. It will be apparent that the mating elements 49, which form the anti-twist devices 36 together with the elements 35, are arranged in a manner oriented over the surface of guide plate 3 in such a way that the radial directions 25' point into the center 66 of guide plate 3 when the point supports 6 are installed, i.e. the effective directions of lower mechanical strength of the individual point supports 6 all point in the direction of the center 66. In the center 66 there is likewise a point support 6, which—like the stepped hole 45 situated there—is likewise oriented in terms of rotational direction. The rotational orientation is preferably aligned in the same way as in the case of at least one adjoining stepped hole 45. As an alternative, however, the alignment in the center 66 can be arbitrary.

To form a test apparatus 67, provision is made for slotted recesses 66 open at the edge to be present in the middle of each side of the square guide plates 2 to 4, said recesses extending in the direction of the center 66. Guide pins 69, which are arranged in a fixed location, engage slidably in the slotted recesses 68. Overall, this creates a center centering device 70 for the test head 1 such that it expands uniformly and only from the middle, i.e. from the center 66, for example, owing to temperature stressing, and the center 66 maintains its position.

If—according to FIG. 1—the test specimen 17 is subjected to different temperatures during electrical testing thereof, this will lead to the individual guide plates 2 to 4 heating to different extents or cooling to different extents. The guide plate 3 close to the test specimen, for example, will heat up more strongly than the guide plate 2 situated further away. Since the point supports 6 are arranged at an angular orientation such that the effective directions of lower mechanical strength are directed toward the center 66, this differential temperature stressing will be evident from slight bending of the point supports 6, although the bending will in each case take place radially outward from the center 66, owing to the aligned effective directions of lower mechanical strength, as a result of which, overall, only minimal displacements occur in the region of the surfaces of the guide plates 2 to 4. In this context, the center centering device 70 mentioned furthermore likewise ensures that displacement is always aligned with the middle, i.e. with the center 66. Overall, therefore, the individual test contact pins 12 are displaced only to a minimal extent or not at all by these differential temperature stresses, i.e. the physical contacts thereof with the test specimen 17 or with the contact clearance enlargement device 18 are not negatively affected. It is clear from FIG. 4 that a very large amount of free space is available on the guide plates 2 to 4 between the individual point supports 6 to enable test contact pins 12 to be accommodated there in corresponding guide holes 9 to 11 (not shown in FIGS. 2 to 7 for the sake of clarity). As a result, a very large number of test circuits can be formed by a single process of lowering the test head 1 onto the test specimen 17.

Figure 7:
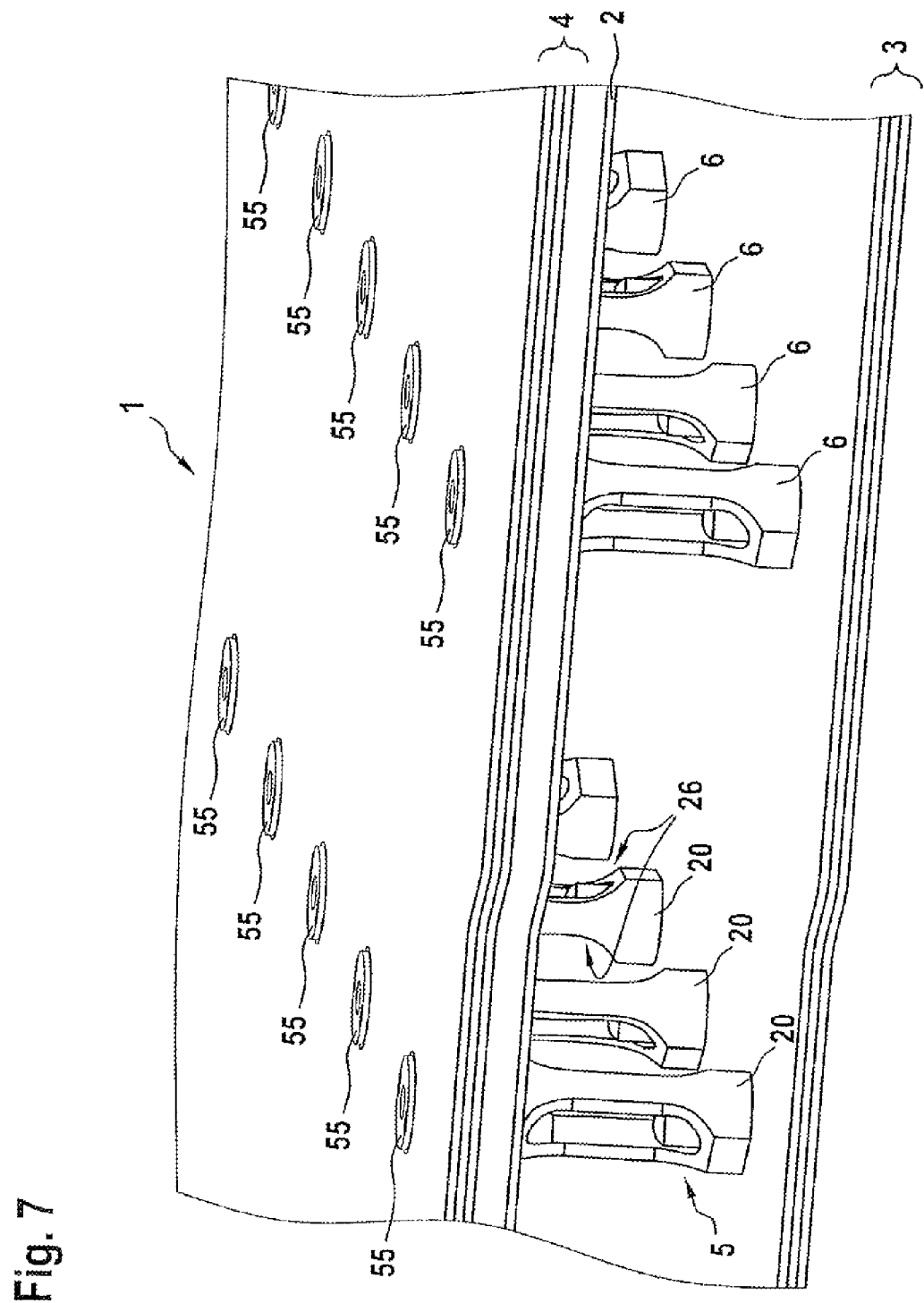
FIG. 7 shows a perspective section through a partial area of the test head.

FIG. 7 illustrates the arrangement in FIG. 4 in a sectioned perspective view. It can be seen here that guide plates 3 and 4 can be of multi-layer construction, being of three-layer construction in the illustrative embodiment shown.

By virtue of the invention, the sagging of the guide plates 2 to 4 which was mentioned above is prevented. By means of the point supports 6 arranged in a manner distributed over the surfaces of the guide plates 2 to 4, a very rigid assembly is created, with the result, for example, that no distortions of guide plates 2 to 4 occur due to friction of the test contact pins 12 against the guide holes 9 to 11. In the Z direction (Cartesian coordinate system), guide plates 2 to 3 are thus protected from the bending mentioned. In order, in particular, to compensate for small displacements in the X and Y direction (Cartesian coordinate system) arising due to temperature differences, i.e. in the planes of the guide plates 2 to 4, the point supports 6 are each made "softer" in a radial direction 25'. This weakening is always aligned with the center 66 of the guide plates 2 to 4. In addition, there is preferably the fact that the test head 1 has a center centering device 70, ensuring that the test head 1 always expands from the center 66 outward. The diameters of the point supports 6 designed as supporting struts 20 are preferably about 3 mm. By virtue of the fact that the point supports 6 are arranged in an isolated manner over an area, unwanted bimetallic effects, which are known from the prior art, and hence sagging of the guide plates 2 to 4 are prevented. Moreover, the individual point supports 6 take up only a small amount of space, and therefore a large area is available for the arrangement of test contact pins 12. By virtue of the positive engagement of the respective anti-twist devices 36, the individual point supports 6 are arranged in a rotationally oriented manner with respect to the respective surfaces of the guide plates 2 to 4, and the weakened contour thereof always points toward the center 66. Even in the event of temperature cycling during the testing of a test specimen 17, from −40° C. to +180° C. for example, there is no risk of bending of the guide plates 2 to 4 to such an extent that the scrub mentioned is impaired and/or cracks can occur in the guide plates, which are composed of ceramics in particular.

According to the illustrative embodiment shown in FIGS. 1 to 7, the heads 55 of the threaded screw elements 54 are countersunk in relation to the surface (top side 16) of guide plate 4. However, it is also conceivable that the heads 55 will project above the surface by virtue of corresponding washers, enabling the heads 55 and hence the test head 1 to be supported on an adjacent component, e.g. on the contact clearance enlargement device 18 mentioned. This results in a rigid construction which is reproducible as regards the position of the components.

The invention claimed is:

1. A test head for electrical testing of a test specimen, said test head comprising:
   at least two guide plates spaced apart by at least one spacer and having guide holes distributed over the surfaces of the guide plates; and
   test contact pins for physical contact with the test specimen, the test contact pins guided in a sliding manner in the guide holes,
   wherein the at least one spacer is formed by a multiplicity of point supports arranged in a manner distributed over the surfaces of the guide plates and secured on the guide plates,
   wherein each of the point supports has at least one cross section weakening zone having lower mechanical strength, the at least one cross section weakening zone having a recess with a longest dimension along a longitudinal direction of the point supports, and
   wherein the point supports are arranged so as to be rotationally oriented over the surfaces of the guide plates in such a way that the effective directions of lower mechanical strength are at least one of aligned with the center of the respective guide plate and aligned approximately with the center of the respective guide plate.

2. The test head according to claim 1, wherein the at least two guide plates comprise a first guide plate and a second guide plate,
   wherein the second guide plate is a guide plate close to the test specimen and the first guide plate is a guide plate remote from the test specimen.

3. The test head according to claim 2, the at least two guide plates comprising a third guide plate arranged adjacent to the first guide plate,
   wherein each test contact pin is assigned a first guide hole in the first guide plate, a second guide hole in the second guide plate, and a third guide hole in the third guide plate,
   wherein the second and third guide holes are in alignment with one another and the first guide hole is offset with respect to the alignment of the second and third guide holes, or all three guide holes are offset with respect to one another.

4. The test head according to claim 1, wherein the point supports are designed as compression-resistant and tension-resistant supporting struts.

5. The test head according to claim 1, wherein each of the point supports has a direction of longitudinal extent and, transversely at right angles thereto, has a multiplicity of radial directions distributed over an angular range of 360°.

6. The test head according to claim 5, wherein the mechanical strength of each of the point supports in at least one of the radial directions is less than in the other radial directions.

7. The test head according to claim 1, wherein each of the point supports has a cross section weakening zone on mutually opposite sides of a circumference thereof.

8. The test head according to claim 1, wherein each of the point supports has a first end zone, a central zone adjoining the latter, and a second end zone adjoining said central zone in the direction of longitudinal extent,
   wherein the central zone has the at least one cross section weakening zone.

9. The test head according to claim 1, wherein each of the point supports has at least one aperture in the region of the cross section weakening zone.

10. The test head according to claim 9, wherein an extent of the depth of the aperture is in a radial direction which is the same or approximately the same as the radial direction with the lower mechanical strength by virtue of the at least one cross section weakening zone.

11. The test head according to claim 9, wherein at least two supporting arms between two end zones of the respective point support are formed by the at least one aperture.

12. The test head according to claim 11, wherein the supporting arms extend parallel or substantially parallel to one another, and the supporting arms extend parallel or substantially parallel to the direction of longitudinal extent of the respective point support.

13. The test head according to claim 11, wherein the two end zones have end faces for support on the guide plates.

14. The test head according to claim 13, further comprising threaded fastening elements comprising shanks,
    wherein the end faces of the respective point support have threaded fastening holes engaging ends of the shanks of the threaded fastening elements passing through the guide plates.

15. The test head according to claim 14, further comprising spacing sleeves,
    wherein the shanks of the fastening elements assigned to one of the end faces pass through two of the guide plates,
    wherein the shanks pass through the spacing sleeves, and the spacing sleeves are arranged between the two guide plates and are supported on said guide plates.

16. The test head according to claim 1, further comprising a center centering device having at least three slotted recesses for accommodating guide pins,
    wherein the directions of longitudinal extent of the slotted recesses are aligned with the center of the respective guide plate or approximately with the center of the respective guide plate.

17. The test apparatus having a test head according to claim 16, wherein the at least three guide pins engage slidably in the at least three slotted recesses in the respective direction of longitudinal extent of the slotted recesses.

18. The test apparatus of claim 17, wherein the at least three guide pins are positioned in a fixed location.

19. The test apparatus of claim 1, wherein the test specimen is a wafer.

20. The test head according to claim 1, wherein the recess is a continuous recess with the longest dimension along a longitudinal direction of the point support.

21. A test head for electrical testing of a test specimen, said test head comprising:
    at least two guide plates spaced apart by at least one spacer and having guide holes distributed over the surfaces of the guide plates;
    test contact pins for physical contact with the test specimen, the test contact pins guided in a sliding manner in the guide holes,
    wherein the at least one spacer is formed by a multiplicity of point supports arranged in a manner distributed over the surfaces of the guide plates and secured on the guide plates; and
    an anti-twist device comprising an element and a mating element,
    wherein the element is positioned on at least one of the end faces of a respective point support, said element interacting with the mating element on the associated guide plate,
    wherein each of the point supports has at least one aperture in a region of a cross section weakening zone, wherein at least two supporting arms between two end zones of the respective point support are formed by the at least one aperture, wherein the two end zones have end faces for support on the guide plates.

22. A test head for electrical testing of a test specimen, said test head comprising:

at least two guide plates spaced apart by at least one spacer and having guide holes distributed over the surfaces of the guide plates;

test contact pins for physical contact with the test specimen, the test contact pins guided in a sliding manner in the guide holes, wherein the at least one spacer is formed by a multiplicity of point supports arranged in a manner distributed over the surfaces of the guide plates and secured on the guide plates;

an anti-twist device including a projection element, wherein the projection element comprises at least one projection spaced apart radially from the associated fastening hole, and a mating element is a depression in the guide plate;

threaded fastening elements comprising shanks, wherein the end faces of the respective point support have threaded fastening holes engaging ends of the shanks of the threaded fastening elements passing through the guide plates wherein each of the point supports has at least one aperture in a region of a cross section weakening zone, wherein at least two supporting arms between two end zones of the respective point support are formed by the at least one aperture, wherein the two end zones have end faces for support on the guide plates.

* * * * *